(12) United States Patent
Burcovich et al.

(10) Patent No.: US 11,209,498 B2
(45) Date of Patent: Dec. 28, 2021

(54) AUTOMOBILE LIGHTING UNIT WITH OLED LIGHT SOURCES AND RELATED OPERATING METHOD

(71) Applicant: Marelli Automotive Lighting Italy S.p.A., Venaria Reale (IT)

(72) Inventors: Carlotta Burcovich, Tolmezzo (IT); Giulio Manfreda, Tolmezzo (IT); Sara Padovani, Tolmezzo (IT)

(73) Assignee: Marelli Automotive Lighting Italy S.p.A., Venaria Reale (IT)

( * ) Notice: Subject to any disclaimer, the term of this patent is extended or adjusted under 35 U.S.C. 154(b) by 0 days.

(21) Appl. No.: 16/832,051

(22) Filed: Mar. 27, 2020

(65) Prior Publication Data

US 2020/0309863 A1  Oct. 1, 2020

(30) Foreign Application Priority Data

Mar. 29, 2019 (EP) .................................... 19166369

(51) Int. Cl.
- *G01R 31/52* (2020.01)
- *B60Q 1/02* (2006.01)
- *G01R 31/26* (2020.01)

(52) U.S. Cl.
CPC ............... *G01R 31/52* (2020.01); *B60Q 1/02* (2013.01); *G01R 31/2635* (2013.01)

(58) Field of Classification Search
CPC .... G01R 31/2635; G01R 31/52; G01R 31/50; G01R 31/54–56; B60Q 1/02; B60Q 1/04
See application file for complete search history.

(56) References Cited

U.S. PATENT DOCUMENTS

| | | | | |
|---|---|---|---|---|
| 9,424,781 | B2 * | 8/2016 | Park | G09G 3/3233 |
| 2003/0071821 | A1 * | 4/2003 | Sundahl | H05B 45/60 |
| | | | | 345/589 |
| 2006/0145604 | A1 * | 7/2006 | Liao | H01L 51/5278 |
| | | | | 313/506 |
| 2006/0232524 | A1 * | 10/2006 | Cok | H05B 45/60 |
| | | | | 345/82 |
| 2007/0290957 | A1 * | 12/2007 | Cok | G09G 3/3225 |
| | | | | 345/77 |
| 2008/0278350 | A1 * | 11/2008 | Berkhahn | G16Z 99/00 |
| | | | | 340/945 |
| 2010/0066375 | A1 * | 3/2010 | Hente | G01R 31/2635 |
| | | | | 324/414 |

(Continued)

FOREIGN PATENT DOCUMENTS

| | | |
|---|---|---|
| KR | 2006 113000 A | 11/2006 |
| WO | WO 2008/120143 A3 | 10/2008 |

OTHER PUBLICATIONS

European Search Report dated Sep. 13, 2019 for European Patent Application 19166369.9.

*Primary Examiner* — Patrick Assouad
*Assistant Examiner* — Demetrius R Pretlow
(74) *Attorney, Agent, or Firm* — McCarter & English, LLP

(57) ABSTRACT

Automobile lighting unit is provided that includes a lighting device equipped with one or more OLED light sources, and an electronic device configured to determine a malfunctioning condition of an OLED light source. The electronic device is suitable to determine a leakage resistance of the OLED light source and determines a malfunctioning condition of the OLED light source based on the leakage resistance.

12 Claims, 5 Drawing Sheets

(56) References Cited

U.S. PATENT DOCUMENTS

| | | | |
|---|---|---|---|
| 2010/0201275 A1* | 8/2010 | Cok | G06F 3/042 315/158 |
| 2011/0204792 A1* | 8/2011 | Siegmund | H05B 45/60 315/119 |
| 2013/0257437 A1* | 10/2013 | Jin | G01R 31/2635 324/414 |
| 2014/0055031 A1* | 2/2014 | Miyamoto | H05B 45/50 315/82 |
| 2016/0007415 A1* | 1/2016 | Kalkschmidt | H02H 3/10 315/121 |
| 2016/0064459 A1* | 3/2016 | Hsu | H01L 27/3276 257/40 |
| 2016/0125811 A1* | 5/2016 | Park | G09G 3/3258 345/694 |
| 2016/0143112 A1* | 5/2016 | Jacobs | H01L 51/5228 315/155 |
| 2017/0118818 A1* | 4/2017 | Tsuchiya | B60Q 11/007 |
| 2017/0215248 A1* | 7/2017 | Regau | H05B 45/10 |
| 2017/0269146 A1* | 9/2017 | Regau | G01R 31/2635 |
| 2017/0345358 A1* | 11/2017 | Xu | G09G 3/2022 |
| 2018/0050631 A1* | 2/2018 | Wonhong | H05B 45/38 |
| 2018/0174931 A1* | 6/2018 | Henley | H01L 33/36 |
| 2018/0213617 A1 | 7/2018 | Regau | |
| 2018/0259570 A1* | 9/2018 | Henley | H05B 45/30 |
| 2018/0306855 A1* | 10/2018 | Gloss | H05B 45/60 |
| 2019/0369157 A1* | 12/2019 | Chambion | G01R 31/2839 |
| 2019/0391308 A1* | 12/2019 | Nomura | H01L 27/32 |
| 2020/0176529 A1* | 6/2020 | Choi | H01L 27/3234 |
| 2020/0193903 A1* | 6/2020 | Park | G09G 3/3233 |

\* cited by examiner

AUTOMOBILE LIGHTING UNIT WITH OLED LIGHT SOURCES AND RELATED OPERATING METHOD

CROSS-REFERENCE TO RELATED APPLICATIONS

This patent application claims priority from European patent application no. 19166369.9 filed on Mar. 29, 2019, the entire disclosure of which is incorporated herein by reference.

TECHNICAL FIELD

The present invention relates to an automobile lighting unit provided with OLED (Organic Light Emitting Diode) light sources, an OLED electronic lighting device preferably installable in an automobile lighting unit, and an operating method for the automobile lighting unit.

In greater detail, the present invention relates to a lighting unit which can be installed in an automobile or a motor vehicle or any similar motorised vehicle, of the type that comprises preferably, but not necessarily: a casing structured in such a way as to be able to be recessed into a bay formed in the vehicle's bodywork; a front lenticular body made at least partially of transparent or semi-transparent material that can be coupled to the casing at its mouth, and an OLED electronic lighting device which is suitable to be housed inside the casing.

BACKGROUND OF THE INVENTION

The use of OLED light sources in the latest generation of automobile lighting units is known. OLED light sources make it easy to obtain homogeneous illuminating surfaces with which to dynamically produce new graphic effects and localised light geometries, so as to achieve multiple lighting functions using the same lighting unit.

However, in the case of the above-mentioned automobile lighting units with OLED light sources, there is still the requirement to be able to determine/detect a failure/breakage condition of the OLED light sources.

SUMMARY OF THE INVENTION

The object of this invention is therefore to produce an automobile lighting unit which meets this requirement.

This objective is achieved by the present invention in that it relates to an automobile lighting unit comprising a lighting device provided with one or more OLED light sources, characterised in that it comprises electronic means configured in such a way as to: determine an electrical resistance of said OLED light source which is indicative of the leakage resistance of the equivalent circuit of the OLED light source; determine a failure condition of said lighting unit/said OLED light source based on said resistance which is indicative of the leakage resistance.

Preferably, the OLED light source comprises one or more light emitting areas; the electronic means are configured to determine a dead area state of at least one of said light emitting areas based on said resistance which is indicative of the leakage resistance.

Preferably, the OLED light source has a multi-pixel light emitting OLED module comprising a plurality of independent light emitting areas, each of which is associated with a pixel; the electronic means are configured to determine the presence of a dead area state of at least one of said light emitting areas associated with a pixel, based on said resistance which is indicative of the leakage resistance.

Preferably, said electronic means are configured to determine the number of said light emitting areas in the dead area state, indicating said respective dead pixels, based on said resistance which is indicative of the leakage resistance.

The OLED light source preferably has a segmented OLED light emitting module comprising a plurality of light emitting areas, each of which is associated with an OLED segment; the electronic means are configured to determine the presence of a dead area state of at least one of said OLED segments, based on said resistance which is indicative of the leakage resistance.

Preferably, the electronic means are configured to determine the number of said light emitting areas in the dead area state, indicating respective OLED dead segments, based on said resistance which is indicative of the leakage resistance.

Preferably, the electronic means are configured to: supply a linearly increasing current ramp to said OLED light source until a built-in voltage is reached across said OLED light source, repeatedly measure the voltage across said OLED light source during said current ramp, determine a current/voltage characteristic curve during said current ramp based on the measured voltages, determine the slope of the current/voltage characteristic curve, determine the resistance which is indicative of the leakage resistance based on said slope.

Preferably, the leakage resistance does not correspond to the impedance measured across the OLED source.

Preferably, the linearly increasing current ramp supplied to said OLED light source is not an alternating current (A-C).

Preferably the linearly increasing current ramp supplied to said OLED light source is a direct current.

The present invention relates to an operating method for an automobile lighting unit comprising a lighting device provided with one or more OLED light sources, characterised in that it comprises the following steps: determine an electrical resistance of said OLED light source which is indicative of the leakage resistance of the equivalent circuit of the OLED light source; determine a failure condition of said lighting unit/said OLED light source based on said resistance which is indicative of the leakage resistance.

Preferably, said OLED light source comprises one or more light emitting areas, said method comprises the step of determining a dead area state of at least one of said light emitting areas based on said resistance which is indicative of the leakage resistance.

Preferably, the OLED light source has a multi-pixel light emitting OLED module comprising a plurality of said light emitting areas, each of which is associated with a pixel; the method comprises the step of determining the presence of a dead area state of at least one of said light emitting areas associated with a pixel, based on said resistance which is indicative of the leakage resistance.

Preferably, this method comprises the step of determining the number of said light emitting areas in the dead area state, indicating said respective dead pixels, based on said resistance which is indicative of the leakage resistance.

The OLED light source preferably has a segmented OLED light emitting module comprising a plurality of light emitting areas each of which is associated with an OLED segment, said method comprising the step of determining the presence of a dead area state of at least one of said OLED segments, based on said resistance which is indicative of the leakage resistance.

Preferably, the method comprises the step of determining the number of said light emitting areas in the dead area state, indicating respective OLED dead segments, based on said resistance which is indicative of the leakage resistance.

Preferably the method comprises the steps of:

supplying a linearly increasing current ramp to said OLED light source until a built-in voltage is reached across said OLED light source, repeatedly measure the voltage across said OLED light source during said current ramp, determine a current/voltage characteristic curve during said current ramp based on the measured voltages, determine the slope of the current/voltage characteristic curve, determine the resistance which is indicative of the leakage resistance based on said slope.

The present invention also relates to a vehicle lighting device provided with one or more OLED light sources, which comprises electronic means configured to: determine an electrical resistance of said OLED light source which is indicative of the leakage resistance of the equivalent circuit of the OLED light source; -determine a failure condition of said lighting unit/said OLED light source based on said resistance which is indicative of the leakage resistance.

Preferably, the OLED light source of the vehicle lighting device comprises one or more light emitting areas; the electronic means are configured to determine a dead area state of at least one of said light emitting areas based on said resistance which is indicative of the leakage resistance.

Preferably, the OLED light source of the vehicle lighting device has a multi-pixel light emitting OLED module comprising a plurality of independent light emitting areas, each of which is associated with a pixel; the electronic means are configured to determine the presence of a dead area state of at least one of said light emitting areas associated with a pixel, based on said resistance which is indicative of the leakage resistance.

Preferably, the electronic means of the vehicle lighting device are configured to determine the number of said light emitting areas in the dead area state, indicating said respective dead pixels, based on said resistance which is indicative of the leakage resistance.

The OLED light source of the vehicle lighting device preferably has a segmented OLED light emitting module comprising a plurality of light emitting areas, each of which is associated with an OLED segment; the electronic means are configured to determine the presence of a dead area state of at least one of said OLED segments, based on said resistance which is indicative of the leakage resistance.

Preferably, the electronic means of the vehicle lighting device are configured to determine the number of said light emitting areas in the dead area state, indicating respective OLED dead segments, based on said resistance which is indicative of the leakage resistance.

Preferably, the electronic means of the vehicle lighting device are configured to: supply a linearly increasing current ramp to said OLED light source until a built-in voltage is reached across said OLED light source, repeatedly measure the voltage across said OLED light source during said current ramp, determine a current/voltage characteristic curve during said current ramp based on the measured voltages, determine the slope of the current/voltage characteristic curve, determine the resistance which is indicative of the leakage resistance based on said slope.

Preferably, the leakage resistance of the equivalent circuit of the OLED light source of the vehicle lighting device does not correspond to the impedance measured across said OLED source.

Preferably, the linearly increasing current ramp supplied to said OLED light source of the vehicle lighting device is not an alternating current (A-C).

Preferably the linearly increasing current ramp supplied to said OLED light source of the vehicle lighting device is a direct current.

BRIEF DESCRIPTION OF THE DRAWINGS

The present invention will now be described with reference to the accompanying drawings, illustrating a non-limiting embodiment thereof, in which.

DETAILED DESCRIPTION OF THE INVENTION

The present invention will now be described in detail with reference to the attached figures so as to allow a skilled person to create and use it. Various modifications to the described embodiments will be readily apparent to skilled persons and the generic principles described may be applied to other embodiments and applications without departing from the protective scope of the present invention as defined in the attached claims. Therefore, the present invention should not be regarded as limited to the embodiments described and illustrated, it should instead be granted the widest scope consistent with the principles and characteristics described and claimed herein.

Figure 1:
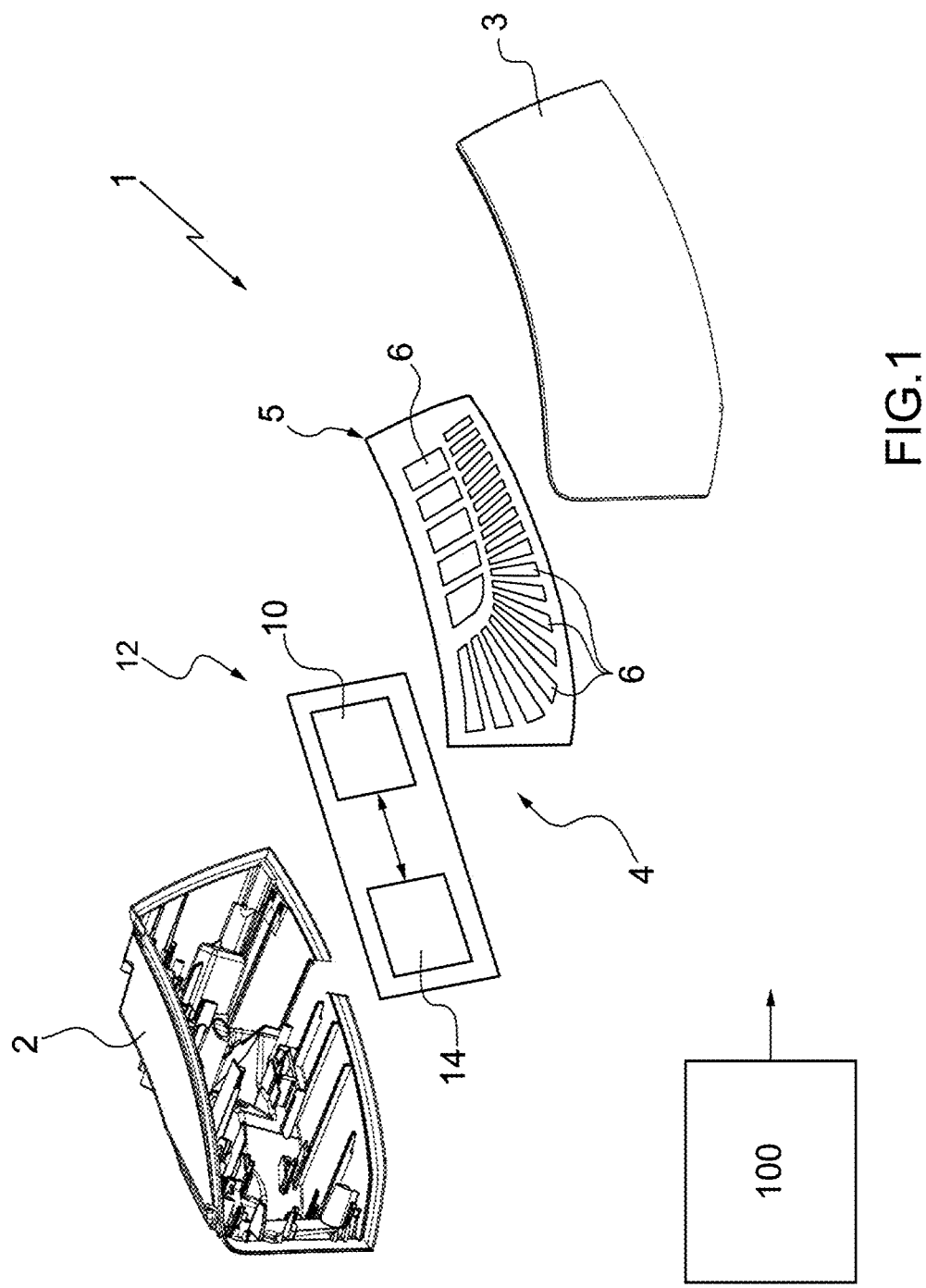
FIG. 1 is an exploded view of an example of an embodiment of an automotive lighting unit made according to the dictates of the present invention.

With reference to FIG. 1, the number 1 illustrates schematically in its entirety an exploded view of an automobile lighting unit made according to an example of an embodiment of the present invention.

The automobile lighting unit 1 may comprise, preferably but not necessarily: a shaped rear casing 2 which is preferably, but not necessarily, cup-shaped. The rear casing 2 may, for example, be structured in such a way that it can preferably, but not necessarily, be recessed, for example, into a bay in the vehicle's bodywork (not shown).

According to the example shown in FIG. 1, the automobile lighting unit 1 may further preferably comprise a front lenticular body 3 made, for example, at least partially of transparent or semi-transparent material. The front lenticular body 3 can be structured in such a way that it can be coupled to the rear casing 2. The front lenticular body 3 can preferably be arranged at the mouth of the rear casing 2 in such a way that it preferably emerges at least partially from the vehicle's bodywork (not shown).

According to the preferred embodiment shown in FIG. 1, the automobile lighting unit 1 further comprises a lighting device 4.

The lighting device 4 may comprise an OLED light emitting circuit 5. The OLED light emitting circuit 5 may comprise one or more OLED light sources 8, i.e. OLEDs, provided with one or more light emitting areas 6.

Figure 7:
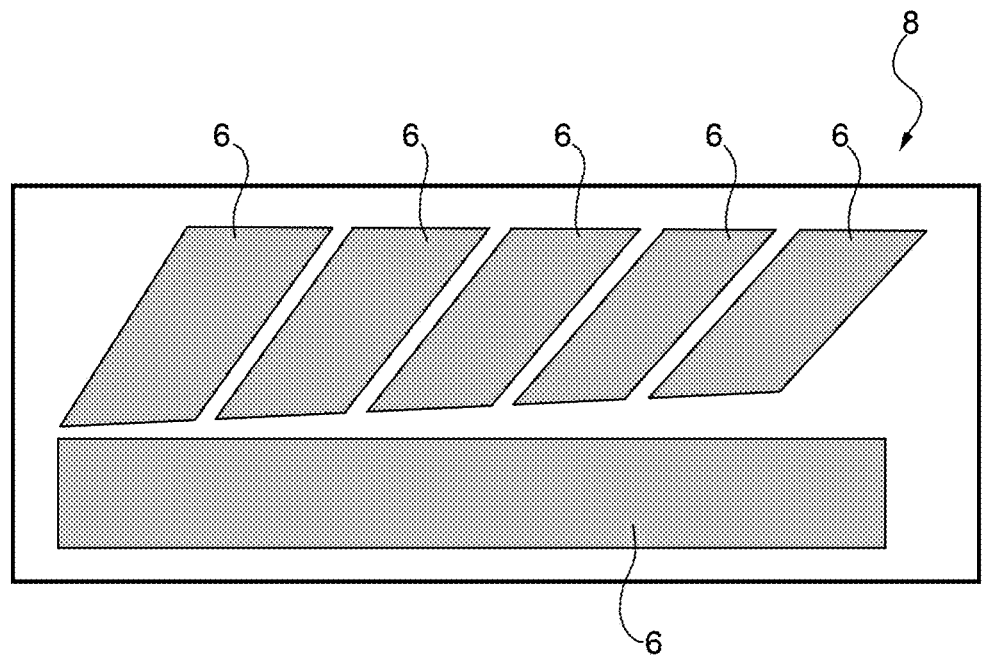
Figure 8:
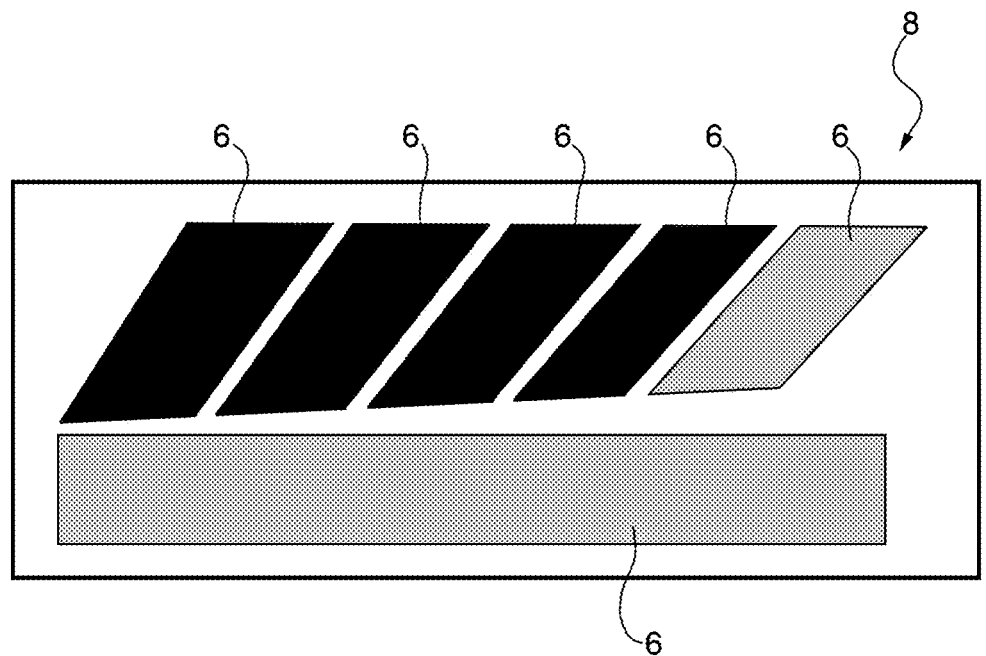

According to a possible embodiment shown in FIGS. 7 and 8, the light emitting areas 6 comprise at least one OLED light source 8, i.e. at least one OLED, which has a so-called "segmented" OLED light emitting structure.

Figure 9:
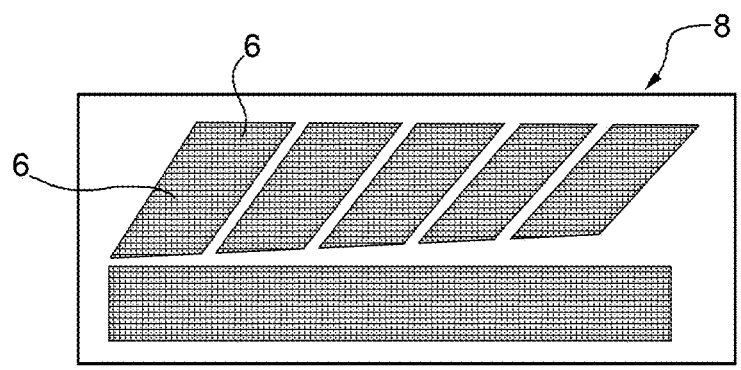
FIG. 9 schematically shows a series of light emitting areas of a multi-pixel OLED light source in the switched-on state in the absence of a failure condition.

Each OLED segment shown in FIGS. 8 and 9 is separated from the other OLED segments and corresponds to an OLED light emitting area 6. The "segmented" OLED light emitting structure may have a circuit configuration having a single cathode (common cathode), and a plurality of independent anodes by means of which it is possible to selectively control a complete and uniform switched-on or switched-off state for each OLED segment, i.e. the entire OLED light emitting area 6.

By way of example, in FIG. 8, the four OLED light emitting areas 6 shown in black are in a "dead area state" described in detail below. The dead area state of an OLED segment corresponds to a so-called OLED dead segment. It should be noted that according to this embodiment, the OLED light emitting areas 6, i.e. the OLED segments, can have a size of the order of a few tens of centimetres.

Figure 10:
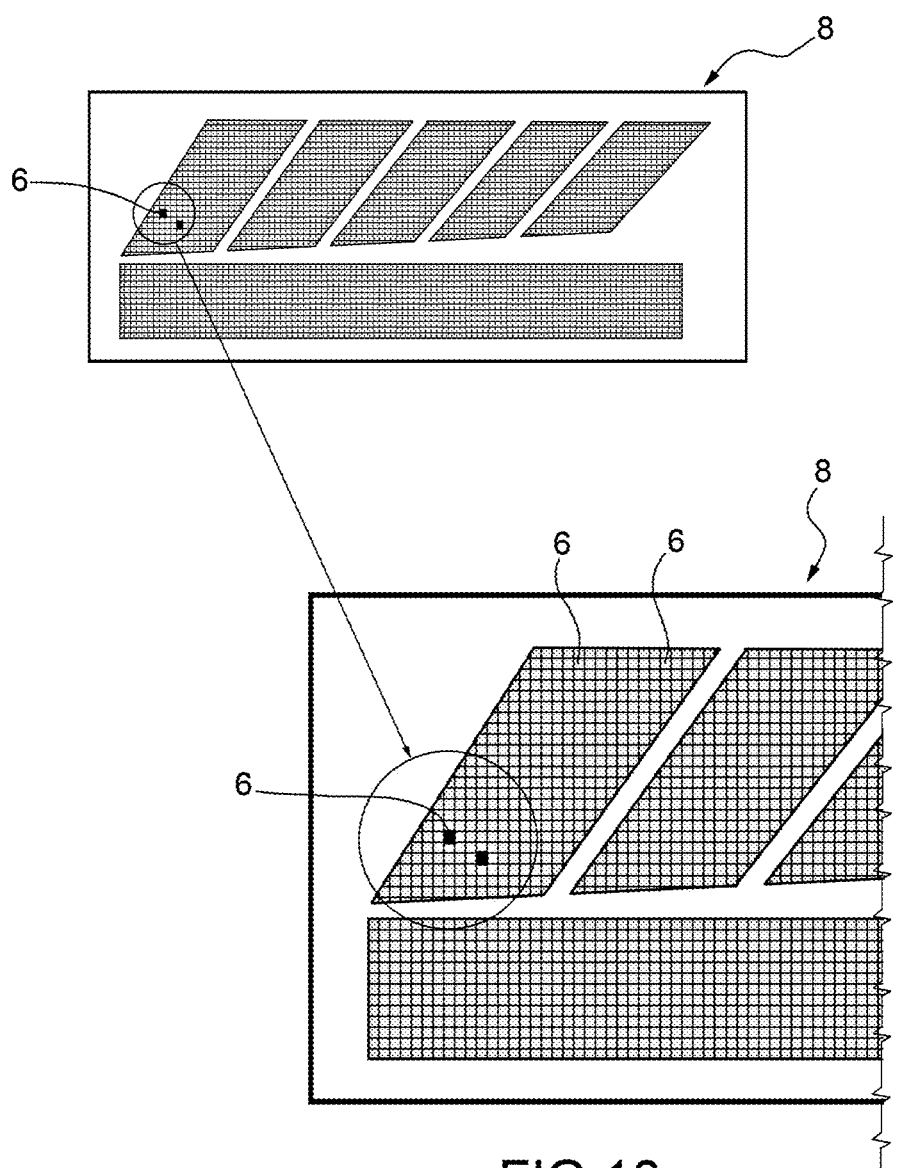
FIG. 10 schematically shows the light emitting areas shown in FIG. 9 in the presence of a failure condition in a black area, shown in enlarged scale, which represents an area the size of a pixel.

According to a different embodiment shown in FIGS. 9 and 10, the OLED light emitting areas 6 are comprised in at least one OLED light source 8, i.e. at least one OLED, which has a so-called "multi-pixel" OLED light emitting structure, wherein each OLED light emitting area 6 is of a small size relative to the size of a "pixel" in a traditional OLED display (of the order of a few millimetres).

By way of example, in FIG. 10 two small OLED light emitting areas 6, shown in black, having a reduced size corresponding to two pixels is in a "dead area state" described in detail below. The dead area states of two OLED light emitting areas 6 of the so-called "multi-pixel" OLED light emitting structure, each corresponds to a so-called dead pixel.

It is understood that the present invention should not be considered limited to the "segmented" OLED light emitting structures and/or to the "multi-pixel" OLED light emitting structures described above and to which explicit reference will be made in the following discussion, but can be applied to any similar OLED lighting structure such as, for example, an OLED structure provided with a plurality of electrically independent OLEDs, i.e. comprising their respective anodes and cathodes.

In a failure condition, a light emitting area 6 of the OLED light source 8 can operate in either a switched-on (ON) state wherein the OLED light emitting area 6 of the OLED light source 8 emits light in response to a pilot signal, or in a switched-off (OFF) state wherein, in the absence of a pilot signal, the OLED light 8 emitting area 6 of the OLED light source 8 does not emit light.

In a failure condition, the state of the light emitting area 6 of the OLED light source 8 may correspond to the "dead area state". In the dead area state, the OLED light emitting area 6 of the OLED light source 8 remains off, i.e. it does not emit light, even when it is supplied with a pilot signal (the anode receives a switch-on voltage).

In order to increase the clarity and understanding of the present invention, FIG. 8 shows for example a "segmented" OLED light source 8 wherein the six respective light emitting areas 6 are shown in grey to indicate a switched-on state, while FIG. 9 shows the same OLED light source 8 wherein four light emitting areas 6 are shown in black to indicate a dead area state.

In order to increase the clarity and understanding of the present invention, FIG. 9 shows instead an example of a "multi-pixel" OLED light source 8 wherein all the light emitting areas 6 are shown in grey to indicate a switched-on state, while FIG. 10 shows the same OLED light source 8 wherein two light emitting areas 6 are shown in black to indicate a dead area state of the two light emitting areas 6.

The lighting device 4 may further comprise an electronic device 12 configured so as to control the OLED light source(s) 8, selectively switching it/them between the switched-on and switched-off states.

According to the present invention, the electronic device 12 is further configured so as to determine a failure condition of the lighting device 4 when it detects the presence of a dead area state in one or more light emitting areas 6 of the OLED light sources 8.

Figure 2:
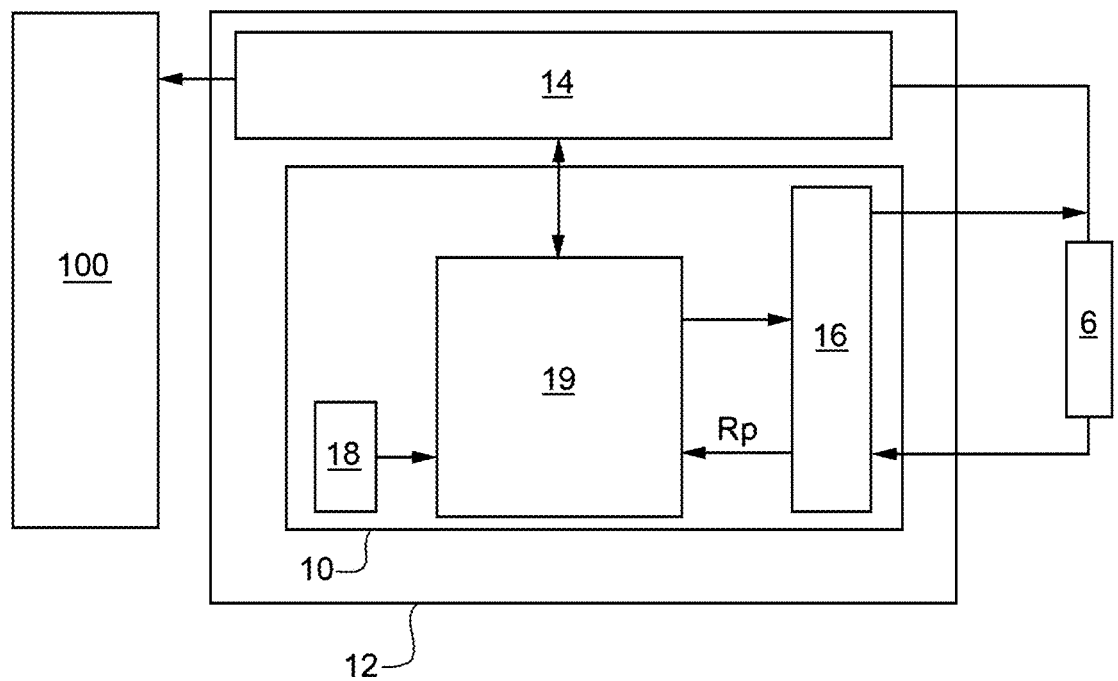
FIG. 2 is a circuit diagram for an example of an embodiment of the electronic control circuit and the electronic diagnostic circuit placed in the automotive lighting unit shown in FIG. 1.

According to a possible embodiment shown in FIG. 2, the electronic device 12 may comprise, for example, an electronic control circuit 14 designed to selectively control the OLED light sources 8 and an electronic diagnostic circuit 10, which is designed to detect/determine the above failure condition of the light emitting area 6 of the OLED light source 8.

Preferably, but not necessarily, as shown in the example in FIG. 1, the control circuit 14 and the electronic diagnostic circuit 10 of the electronic device 12 may both be arranged in a single common PCB.

However, it is understood that the control circuit 14 and the electronic diagnostic circuit 10 of the electronic device 12 can be arranged in separate respective electronic PCB boards, or in the same electronic board in which the OLED light emitting circuit 5 is mounted.

According to an example of a preferred embodiment shown in FIG. 1, the lighting device 4 could be conveniently placed in the automobile lighting unit 1 in such a way that it directly or indirectly faces the front lenticular body 3 to perform a lighting function and/or any vehicle light signaling function on the exterior of the vehicle (not shown).

It is understood that in the following description the term "automobile lighting unit" shall be understood as follows: a front light, a rear light, at least one external marker/position lamp, at least one direction indicator lamp (commonly indicated with an arrow), at least one brake light/stop lamp (commonly indicated by stop), at least one fog lamp, at least one reversing lamp, at least one dipped-beam lamp, at least one main-beam lamp, or any other type of lamp/light which can be installed in a similar motor vehicle, preferably a motor vehicle.

According to a preferred embodiment shown in FIG. 1, the lighting device 4 may preferably, but not necessarily, be housed inside the automobile lighting unit 1, for example in the rear casing 2.

However, it is understood that the present invention is not limited to the positioning of the electronic lighting device 4 inside the automobile lighting unit 1. In particular, the electronic lighting device 4 could be placed in and/or integrated into other parts of the vehicle. For example, the electronic lighting device 4 could be positioned on the rear window and/or in/on the vehicle's bodywork/chassis.

According to a preferred embodiment shown in FIG. 1, the OLED light sources 8 of the OLED light emitting circuit 5 can be controlled, being selectively switchable to the switched-on (ON) and switched-off (OFF) state, by the electronic control circuit 14 on the basis of one or more control signals supplied by a central control unit 100 (for example an electronic control unit) mounted in the vehicle. It is understood that the central control unit 100 may be comprised in the automobile lighting unit 1.

According to a preferred embodiment shown in FIG. 2, the electronic control circuit 14 can be configured to receive a signal from the electronic diagnostic circuit 10, indicating a failure condition caused by the presence of a dead area state in one or more light emitting areas 6 of the OLED light source 8.

The electronic control circuit 14 can further be configured to communicate with the central control unit 100 to provide it with signals indicating at least a failure condition indicative of the dead area state in one or more light emitting areas 6 of the OLED light source 8.

The electronic control circuit 14 can be connected to the central control unit 100 by at least one communication bus (not shown) to receive the control signals and can be provided in turn with control terminals to supply the pilot signals to selectively control one or more OLED light sources 8.

The pilot signals generated by the electronic control circuit 14 can cause the OLED light sources 8 to be switched to the switched-on (ON) state or alternately the switched-off (OFF) state.

It is understood that the pilot signals provided by the electronic control circuit 14 can also cause an adjustment to a controlling electrical quantity for the OLED light sources 8, for example a current or a voltage, so as to determine a corresponding modulation of and/or change in one or more of its lighting parameters, for example the light intensity and/or colour.

It is understood that other embodiments of the electronic device 12 are possible.

For example, the electronic device 12 could comprise a static configuration register, not shown, which contains a predefined control/command configuration indicative of current values to be applied to the OLED sources 8.

This register could in turn be contained in a memory installed in the same electronic board (not illustrated) which houses the control circuit 14.

As regards the electronic diagnostic circuit 10, it can be configured to communicate unidirectionally and/or bidirectionally with the electronic control circuit 14 and/or the central control unit 100. The central control unit 100 can be configured in such a way as to provide the above control signals on the basis of one or more data/electrical signals indicating a failure condition of the OLED light source 8 detected by the electronic device 12.

According to a preferred embodiment shown in FIGS. 2 and 3, the electronic device 12 can be configured to: determine/measure a leakage resistance Rp (described in detail below) of the OLED light source 8, and determine a failure condition based on the determined/measured leakage resistance Rp. The leakage resistance Rp corresponds to the resistance of the equivalent OLED circuit through which the leakage current flows.

The fault condition may be indicative of a failure of the lighting unit 1 and/or a failure of the lighting device 4 and/or a failure of the OLED light source 8.

The applicant has found that the value of the leakage resistance Rp of the electrical circuit/model of the OLED light source 8 (shown in FIG. 3) is indicative of a failure condition of the OLED light source 8 of the lighting device 4 of the lighting unit 1.

The failure condition of the OLED light source 8 detectable based on the leakage resistance Rp is also indicative of a dead area state of at least one light emitting area 6 of the OLED light source 8.

In the embodiment in which the OLED light source 8 is segmented (FIGS. 7 and 8), the failure condition detectable based on the leakage resistance Rp is indicative of the presence of a dead area state of the light emitting area 6 of at least one of the OLED segments of the source 8 itself, i.e. an OLED dead segment.

In the embodiment in which the OLED light source 8 has a multi-pixel OLED circuit structure/architecture, the failure condition detectable based on the leakage resistance Rp is advantageously indicative of the presence of a dead area state of the light emitting area 6 of at least one pixel of the LED light source 8, i.e. a dead pixel.

Figure 3:
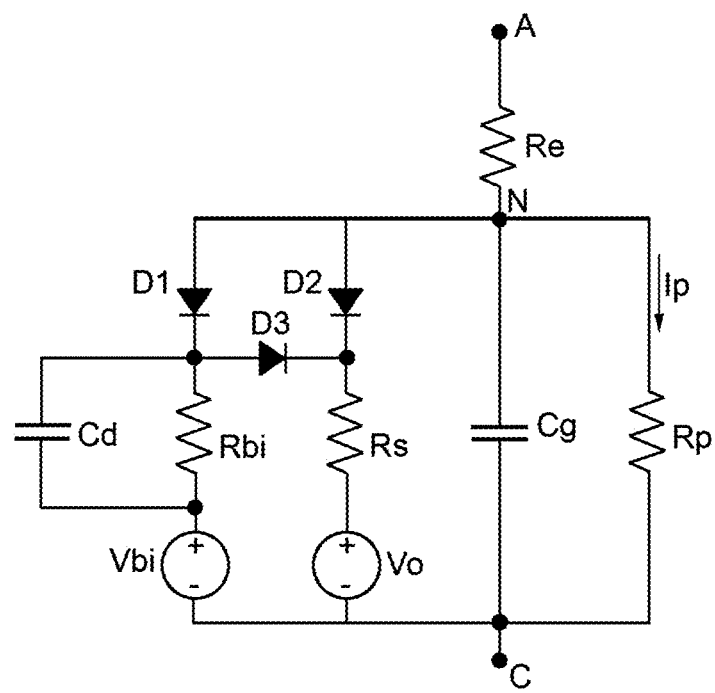
FIG. 3 shows a circuit model equivalent to eleven components of an OLED light source, provided with the leakage resistance.

The FIG. 3 shows an equivalent electrical circuit model of an OLED of the OLED light source 8 which is useful for understanding the meaning of the leakage resistance Rp. The OLED equivalent electrical circuit comprises eleven elements, and is different from the simplified equivalent models with three components.

Figure 4:
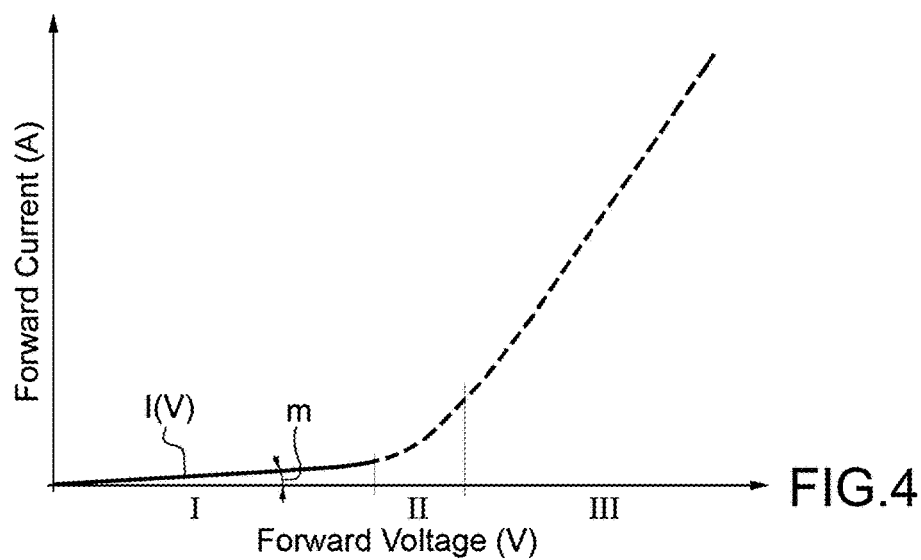
FIG. 4 is a graph showing the current/voltage trend in the three operating regions of an OLED light source.

The operation of the equivalent electric circuit with eleven elements is shown in FIG. 4 and provides for a division of the voltage-current characteristic of the OLED 8 in three different operating regions I, II, III.

With reference to FIGS. 3 and 4, the equivalent electrical circuit comprises:

a resistor connected between the anode terminal A and a node N which has a resistance Re which is indicative of the resistance of a related OLED electrode in the OLED light source 8, a first electrical branch connected between the node A and the cathode terminal C, along which an ideal diode D1, a resistor having a built-in resistance Rbi, and a voltage generator Vbi representing the built-in voltage of the OLED light source 8 are connected in series, a second electrical branch connected between the node N and the cathode terminal C, along which an ideal diode D2, a resistor with a resistance Rs, and a voltage generator Vo representing the threshold voltage for the OLED of the OLED light source 8 necessary to a substantial/significant current to flow through the OLED, a diode D3 connected between the anodes of the two ideal diodes D1 and D2, a capacitor connected in parallel to the resistor with resistance Rbi and having a diffusion capacitance Cd which represents the dependence of the OLED capacitance on the voltage, frequency and material of the cathode, a capacitor with a geometric capacitance Cg associated with the form factor of the OLED connected between the node N and the cathode C, a resistor with a leakage resistance Rp, which is connected in parallel to the geometric capacitance capacitor Cg and through which the leakage current Ip flows.

It should be noted that the leakage resistance Rp according to the present invention does not correspond to the overall impedance (generally indicated with Z) of a simplified equivalent three-component circuit of an OLED (shown in FIG. 5) equipped with an resistance RF, a capacitance CT, an ideal diode D wherein a current I(V) flows.

In particular, unlike the overall impedance measured between the anode and cathode terminals A-C, the leakage resistance Rp of the equivalent circuit shown in FIG. 3, does not depend either on the frequency of the drive signal or on the capacitances Cd and Cs of the equivalent circuit of the OLED.

It should also be noted that the applicant has found that, unlike the OLED impedance, the leakage resistance Rp is conveniently indicative specifically of the presence of a failure of the OLED light source caused by one or more OLED dead pixels or dead segments.

With reference to a possible example of an embodiment shown in FIG. 2, the electronic diagnostic circuit 10 may comprise: an electronic measuring device 16 designed to measure the leakage resistance Rp of the OLED light source 8, preferably, but not necessarily, a memory device 18 designed to store at least one predetermined resistive threshold indicative of the absence of a failure condition of the OLED light source 8, an electronic processing device 19, which determines the failure condition of the OLED light source 8 on the basis of the leakage resistance Rp and the predetermined resistive threshold. For example, the failure condition of the OLED source 8 can be determined when the leakage resistance Rp satisfies a predetermined condition with the resistive threshold.

For example, the failure condition of the OLED source 8 can be determined when the leakage resistance Rp is lower than, and/or equal to, the predetermined resistive threshold.

According to a possible embodiment, the memory device can store a plurality of predetermined resistive thresholds indicative of the presence of dead area states of the same number of light emitting areas 6 in an OLED light source 8.

The applicant has in fact found that the leakage resistance Rp of the equivalent circuit described above is also indicative of the number of light emitting areas 6 in the dead area state in the OLED light source 8.

The electronic processing device 19 can then determine the number of light emitting areas 6 in the dead area state present in the OLED 8 light source on the basis of the predetermined Rp leakage resistance and resistive thresholds.

For example, the electronic processing device 19 may determine the presence of a predetermined number of light emitting areas 6 in the dead area state when the leakage resistance Rp meets a predetermined condition with a resistive threshold associated with said predetermined number of light emitting areas 6 in the dead area state.

It is understood that the predetermined resistive thresholds can be determined by laboratory tests performed on the OLED light source 8 during which a leakage resistance Rp is determined/calculated/measured with a light emitting area 6 in the dead area state and/or when the number of light emitting areas 6 in the dead area state changes.

The applicant has found that as the number of light emitting areas 6 increases in the dead area state of the OLED light source 8, there is a reduction in the leakage resistance Rp of the OLED light source 8.

It is understood that the electronic processing device 19 can determine the failure condition and/or in particular the number of light emitting areas 6 in the dead area state, in addition to, or as an alternative to, using the predetermined resistive thresholds, by means of predetermined diagnostic functions.

For example, the electronic processing device 19 may implement a mathematical function and/or calculation algorithm to provide the number of light emitting areas 6 in the dead area state of the OLED light source 8 based on the calculated/determined leakage resistance Rp.

Figure 6:
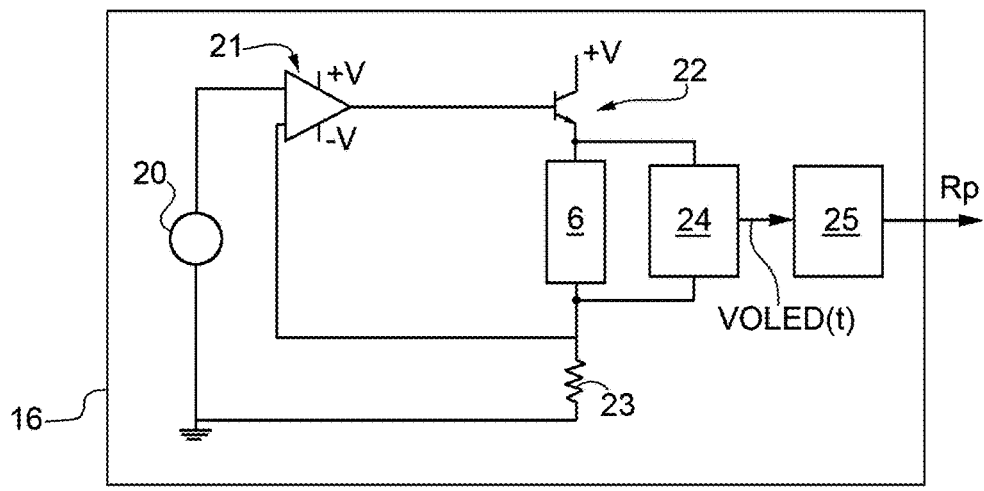
FIG. 6 is a circuit diagram for an example of an embodiment of the electronic measuring device of the electronic diagnostic circuit placed in the automotive lighting unit shown in FIG. 2, FIG. 7 schematically shows a series of light emitting areas of a segmented OLED light source in the switched-on state in the absence of a failure condition, FIG. 8 schematically shows the light emitting areas shown in FIG. 7 in the presence of a failure condition in the four black areas on the left.

For example, FIG. 6 shows a possible embodiment of the electronic measuring device 16. In the example shown, the electronic measuring device 16 comprises: a current generating stage 20, an amplification stage 21 e.g. an operational amplifier, a transistor 22, a resistor 23, a voltage measuring stage 24, and a processing stage 25 to determine the leakage resistance Rp.

The current generating stage 20, the amplification stage 21 and the transistor 22 can be connected to each other and to the OLED light source 8 in order to operate as current sources that supply/provide an increasing current ramp to the OLED light source 8.

Figure 5:
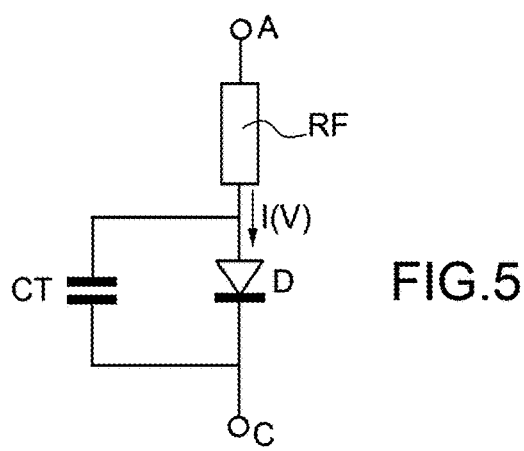
FIG. 5 shows a traditional circuit model equivalent to three components of an OLED light source.

It is understood that the increasing current ramp supplied to the OLED light source 8 does not correspond to an alternating current signal over time, i.e. an alternating current signal A-C, which may be necessary for the calculation of an overall impedance of the equivalent circuit in a three-component model shown in FIG. 5. On the contrary, the increasing current ramp could comprise an increasing rectilinear and linear increasing current ramp.

The voltage measuring stage 24 can be connected to the OLED light source 8, e.g. to the cathode and anode to measure/sample the voltage at predetermined intervals during the supply of the increasing current ramp.

The voltage measuring stage 24 can also cooperate with the current generating stage 20 to interrupt the increasing rectilinear and linear current ramp when the measured voltage VOLED(t) reaches a predetermined voltage threshold which is indicative of the end of the first operating region I of the OLED (FIG. 4).

Preferably, the predetermined voltage threshold ending the first operating region I may correspond to the built-in voltage of the OLED light source 8.

The processing stage 25 can be configured in such a way as to: receive the VOLED(t) voltage values measured by the voltage measuring stage 24, determine on the basis of the supplied current ramp, the current/voltage growth characteristic or curve/function I(V) substantially linear and rectilinear in the first operating region I shown schematically in FIG. 4.

The processing stage 25 can be configured to determine a value indicative of the slope m (angle coefficient) of the rectilinear growth curve/function I(V) in the first region I, and determines the leakage resistance Rp as a function of the determined slope m.

For example, the processing stage 25 may determine the leakage resistance Rp by implementing a reverse function of the slope m, that is: $Rp=1/m$.

As described above, the electronic device 12 can therefore conveniently communicate the failure condition of the OLED light source 8 to the central control unit 100.

The electronic device 12 can also conveniently communicate to the central control unit 100 an indication of the presence of the dead area state in one or more light emitting areas 8 of the OLED light source 8.

The electronic device 12 can also conveniently communicate to the central control unit 100 the number of light emitting areas 6 of the OLED light source 8 that are in the dead area state.

The electronic control circuit 14 and/or central control unit 100 can be configured to perform control operations of the lighting unit 1 and/or LED light sources 6 based on the failure condition, and/or the light emitting areas 6 in dead area state, and or the number of light emitting areas 6 in dead area state.

Control operations may include, for example: switching off the OLED light source 8 on the basis of the number of light emitting areas 6 in the dead area state, and/or providing the user with information indicating the failure state of the lighting unit (warning), and/or providing the user with information indicating the failure state of the OLED light source 8, for example the OLED segment showing a failure, and/or storing failure data in a memory for further processing and/or all other treatments related to failure management.

The operating method for the lighting unit described above may comprise the following steps: determine/calculate/measure the leakage resistance Rp associated with the OLED equivalent circuit of the OLED light source 8, determine the failure condition of the OLED light source 8 on the basis of the leakage resistance Rp.

The operating method for the lighting unit described above comprises: communicating to the control unit 100 information about the failure condition of the OLED light source 8, and/or the light emitting areas 6 in the dead area state, and/or the number of light emitting areas 6 in the dead area state.

Preferably, the method also comprises the step of turning off the OLED light source 8 based on the number of light emitting areas 6 in the dead area state. Preferably, the method also comprises the step of feeding a linearly increasing current ramp to the OLED light source 8 preferably until a built-in voltage is reached across the OLED light source 8, repeatedly measuring the VOLED(t) voltage across the OLED light source 8 during the supply of the increasing current ramp to the OLED light source 8, determining an current/voltage characteristic curve I(V) over time during the supply of the current ramp based on the measured voltages VOLED(t), determining a value m which is indicative of the slope/angular coefficient of said current/voltage characteristic curve I(V), and calculating the leakage resistance Rp based on the determined value m.

The benefits of the lighting unit described above are as follows.

The system makes it possible to detect a failure condition of the OLED light source by means of a solution which is simple and therefore economical to implement. The detection of dead pixels and/or OLED dead segment in the lighting unit is also advantageous from the photometric point of view, as it determines a current absorption condition that could heavily reduce the light emission from the lighting unit with the risk that this emission is reduced to a value lower than the values indicated by the regulations.

Finally, it is clear that the automobile lighting unit, the operating method of said lighting unit and the lighting device described and explained above may be subject to modifications and variations without thereby departing from the scope of the present invention.

The invention claimed is:

1. An automobile lighting unit (1) comprising (i) a lighting device (4) provided with one or more OLED light sources (8), wherein said one or more OLED light sources comprise one or more light emitting areas (6), and (ii) an electronic device (12) configured to:
   determine an electrical resistance of said one or more OLED light sources (8) indicative of leakage resistance (Rp) of an equivalent circuit of the one or more OLED light sources (8);
   determine a failure condition on the basis of said resistance indicative of the leakage resistance (Rp); and
   determine a dead area state of at least one of said one or more light emitting areas (6) on the basis of said resistance indicative of the leakage resistance (Rp).

2. The automobile lighting unit according to claim 1, wherein said one or more OLED light sources (8) has a multi-pixel light emitting OLED structure comprising the one or more light emitting areas (6), independent of each other, each of which is associated with a pixel, said electronic device (12) is configured to determine the presence of a dead area state indicative of a dead pixel of the one or more light emitting areas (6) on the basis of said resistance indicative of the leakage resistance (Rp).

3. The automobile lighting unit according to claim 2, wherein said electronic device (12) is configured to determine the number of said light emitting areas (6) in the dead area state, which is indicative of the respective dead pixels number, based on said resistance which is indicative of the leakage resistance (Rp).

4. The automobile lighting unit according to claim 1, wherein at least one of said one or more OLED light sources (8) has a segmented OLED light emitting structure comprising a plurality of light emitting areas (6), each of which is associated with an OLED segment, wherein said electronic device (12) is configured to determine the presence of a dead area state of at least one of said OLED segments, on the basis of said resistance indicative of the leakage resistance (Rp).

5. The automobile lighting unit according to claim 4, wherein said electronic device (12) is configured to determine the number of said light emitting areas (6) in the dead area state, indicating said respective OLED dead segments number, based on said resistance which is indicative of the leakage resistance (Rp).

6. The automobile lighting unit according to claim 1, wherein said electronic device (12) is configured to:
   supply a linearly increasing current ramp to said one or more OLED light sources (8) until a built-in voltage is reached across said one or more OLED light sources (8),
   repeatedly measure the voltage (VOLED(t)) across said one or more OLED light sources (8) during the supply of said current ramp,
   determine a current/voltage characteristic curve (I(V)) during said current ramp on the basis of the measured voltages (VOLED(t)),
   determine the slope (m) of said current/voltage characteristic curve (I(V)),
   determine the resistance indicative of the leakage resistance (Rp) on the basis of said slope (m).

7. An operating method of an automobile lighting unit comprising a lighting device (4) provided with one or more OLED light sources (8), wherein said one or more OLED light sources (8) comprise one or more light emitting areas (6), wherein the method comprises the following steps:
   determine an electrical resistance of one of said one or more OLED light sources (8) indicative of the leakage resistance (Rp) of an equivalent circuit of the OLED light source (8);

determine a failure condition on the basis of said resistance indicative of the leakage resistance (Rp); and determine a dead area state of at least one of said one or more light emitting areas (6) on the basis of said resistance indicative of the leakage resistance (Rp).

8. The method according to claim 7, wherein said one or more OLED light sources (8) has a multi-pixel light emitting OLED module comprising said one or more light emitting areas (6), each of which is associated with a pixel, said method further comprises the step of determining the presence of a dead area state of at least one of said one or more light emitting areas (6) associated with a pixel, on the basis of said resistance indicative of the leakage resistance (Rp).

9. The method according to claim 8, further comprising the step of determining the number of said light emitting areas (6) in the dead area state, indicative of the respective dead pixels number, based on said resistance which is indicative of the leakage resistance (Rp).

10. The method according to claim 7, wherein at least one of said one or more OLED light sources (8) has a segmented OLED light emitting module comprising a plurality of light emitting areas (6), each of which is associated with an OLED segment, said method further comprising the step of determining the presence of a dead area state of at least one of said OLED segments, on the basis of said resistance indicative of the leakage resistance (Rp).

11. The method according to claim 10, further comprising the step of determining the number of said light emitting areas (6) in the dead area state, indicating of respective OLED dead segments, based on said resistance which is indicative of the leakage resistance (Rp).

12. The method according to claim 7, further comprising the steps of:

supply a linearly increasing current ramp to said one or more OLED light sources (8) until a built-in voltage is reached across said one or more OLED light sources (8), repeatedly measure the voltage (VOLED(t)) across said one or more OLED light sources (8) during said current ramp, determine a current/voltage characteristic curve (I(V)) during said current ramp on the basis of the measured voltages (VOLED(t)), determine the slope (m) of said current/voltage characteristic curve (I(V)), determine the resistance indicative of the leakage resistance (Rp) on the basis of said slope (m).

* * * * *